United States Patent

Cohen

[15] 3,649,851

[45] Mar. 14, 1972

[54] HIGH CAPACITANCE DRIVING CIRCUIT

[72] Inventor: Burton E. Cohen, Huntington Station, N.Y.

[73] Assignee: General Instrument Corporation, Newark, N.J.

[22] Filed: Feb. 25, 1970

[21] Appl. No.: 13,870

[52] U.S. Cl. ..............................307/270, 307/246, 307/255, 307/262, 307/313

[51] Int. Cl. ........................................H03k 1/00, H03k 3/26

[58] Field of Search ..................307/254, 255, 246, 262, 270, 307/313; 330/13, 17

[56] References Cited

UNITED STATES PATENTS

| | | | |
|---|---|---|---|
| 3,319,086 | 5/1967 | Yee | 330/13 X |
| 3,359,433 | 12/1967 | Thauland | 307/255 X |
| 3,426,245 | 2/1969 | Yurasek et al. | 307/313 X |
| 3,440,551 | 4/1969 | Narud et al. | 307/270 X |
| 3,544,808 | 12/1970 | Mukai | 307/214 |

*Primary Examiner*—Stanley D. Miller, Jr.
*Attorney*—James & Franklin

[57] ABSTRACT

A circuit for providing signals to a high-capacitive load is described which comprises a pair of complementary input switching devices and a pair of complementary output switching devices. One of the former is initially turned on by an input pulse to thereupon cause a corresponding one of the latter to turn on, thereby to rapidly charge an output terminal to a desired level. Thereafter, the drive on the conducting input device and the current supplied to the output terminal are reduced while the output terminal remains clamped at the desired level.

28 Claims, 1 Drawing Figure

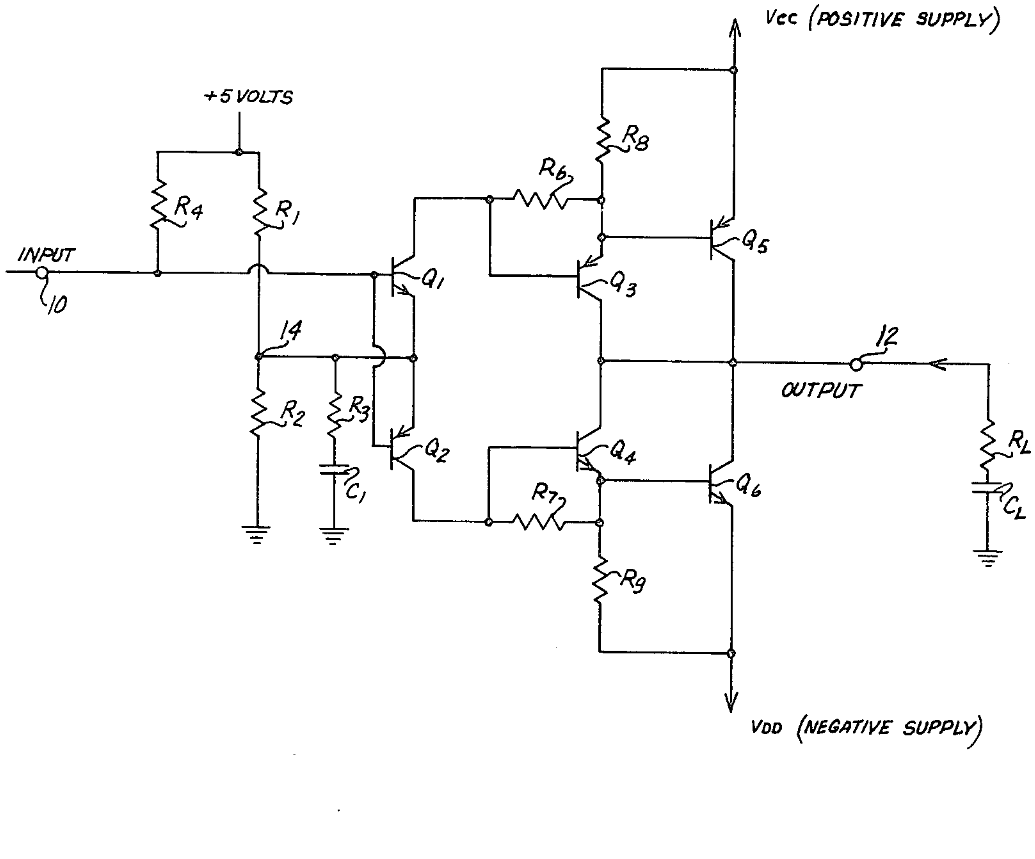
INVENTOR
BURTON E. COHEN
BY
Sandoe, Hopgood & Calimafde
ATTORNEYS

HIGH CAPACITANCE DRIVING CIRCUIT

The present invention relates generally to driver circuits, and particularly to driver circuits having the capability of supplying pulse signals to capacitive loads.

In most logic and digital processing circuits, clock signals derived from a system clock source are used to provide the timing signals which control the operation of those circuits. In systems having a great number of such circuits, driver circuits are required to process the clock signals to supply the circuits with timing signals having the appropriately high values of current. These driver circuits are often required to operate into a relatively high-capacitance load established by the resultant input capacitances of the circuits connected to its output.

Among the desired operating characteristics of such driver circuits, the most important are usually the ability to provide output pulses having fast rise and fall times, and to supply a high-current pulse with a minimum drain on the system power supply. Moreover, the driver circuit should be capable of supplying pulses to high-capacitance loads without producing significant degradation in the pulse shape.

While the known driver circuits have satisfied one, or possibly two, of these optimum design criteria, there is still no available driver circuit which satisfies all the design goals listed above for optimum circuit operation. This is largely a result of the fact that a transistor capable of providing high currents normally has a high storage time, and is thus unable to switch on and off with sufficiently high speed in response to input signals applied thereto. Thus, in the known circuits, one factor, e.g., high load current must often be sacrificed or traded off to achieve the other design goal, high switching speeds.

It is thus an object of the present invention to provide an improved driver circuit having high switching speeds and reduced power dissipation.

It is another object of the present invention to provide a clock driver circuit capable of supplying pulses to high-capacitance loads, while maintaining hard clamps on both the positive and negative excursions of the output signal of the circuit.

It is a further object of the present invention to provide a clock driver circuit of the type described in which large currents are supplied to the load during the period in which the output is changing, and in which the load current is substantially reduced when the output is stable.

To these ends, the driver circuit of the present invention, as broadly contemplated, comprising an input pair of complementary switching devices operatively connected to corresponding ones of a pair of output complementary switching devices. One of the input devices is turned on by one level of an input clock pulse causing the corresponding output device to be conductive, thereby to rapidly charge an output terminal to one of the desired levels of an output signal. Means are provided to thereafter reduce the drive on the input device, which in turn causes the output device to clamp the output terminal at the desired level while reducing the level of current supplied thereto.

In the embodiment of the invention specifically described herein, the output switching device is in the form of a pair of switching devices connected in cascade to the input switching device. Each of the former devices is connected between a signal source of one of the desired output levels and to the output terminal. One of these devices is a high-speed, low-current device, while the other is a low speed, and high-current device.

Both of the output devices are rendered conductive upon the actuation of the corresponding input switching device. However, when the drive from the input device is reduced, the high-current, low speed device is turned off, but the output terminal remains hard clamped to the signal source through the still conducting low-current device. In this manner, the output terminal is charged quickly at a high level of current, but after reaching a stable level it remains clamped to that level at a low supply of current.

As herein described, the means for reducing the drive of the input switching device is in the form of a capacitor connected to the input device. When the input device is turned on, the capacitor is charged until the output terminal is charged to a stable level, at which time the capacitor becomes charged to a voltage which is sufficient to reduce the driving signal applied to the input switching device.

To the accomplishment of the above and to such further objects as may hereinafter appear, the present invention relates to a clock driver circuit as defined in the appended claims, and as described in the following specification taken together with accompanying drawing in which the single FIGURE is a schematic diagram of a clock driver circuit according to one embodiment of the invention.

Referring now to the FIGURE, the driver circuit of the invention comprises an input terminal 10 at which a clock pulse signal is applied, and an output terminal 12 at which a bipolar output clock signal is derived. That output signal is adapted to be supplied to a high-capacitance load having an equivalent resistance $R_L$ and an equivalent capacitance $C_L$.

Input terminal 10 is connected to the bases of a pair of complementary, to wit, NPN and PNP, input transistors Q1 and Q2. A suitable bias is supplied to these transistors by resistors R1 and R2 connected between a low voltage (e.g., =5 volt) source and ground. The junction point 14 between the resistors R1 and R2 is connected to the emitters of transistors Q1 and Q2. Also connected to those emitters are a resistor R3 and a capacitor C1, which are series connected between point 14 and ground. When the input clock signals at terminal 10 are derived from a TTL driver, a resistor R4 may be connected between the +5 volt source and input terminal 10 as a pullup resistor, to ensure that the positive-going portion of the input clock signal is not a function of the TTL driver employed.

The collectors of transistors Q1 and Q2 are respectively connected to the bases of complementary intermediate transistors Q3 and Q4, the emitters of which are in turn connected to the bases of complementary output transistors Q5 and Q6. The collectors of transistors Q3–Q6 are all connected to output terminal 12. Transistors Q3 and Q4 are preferably low-current and high switching speed transistors, and output transistors Q5 and Q6 are preferably high-current and low switching speed transistors.

Resistors R6 and R7 are respectively connected between the bases and emitters of transistors Q3 and Q4, and resistors R8 and R9, which are of lower values of resistance than resistors R6 and R7, are respectively connected between the emitters of transistors Q3 and Q5, and between the emitters of transistors Q4 and Q6. The emitters of transistors Q5 and Q6 are also respectively connected to the $V_{CC}$ positive voltage source and the $V_{DD}$ negative voltage source. These voltage sources can thus be considered as being respectively operatively connected to the collectors of transistors Q1 and Q2 through the series-connected pairs of resistors R6 and R8, and resistors R7 and R9.

The input clock pulse is assumed for purposes of describing the operation of the circuit, as varying between zero and +5 volts. When the input is at 0 volts the voltage across capacitor C1 is approximately 0.7 volts. When the input signal rises to +5 volts, transistor Q1 turns on and draws a relatively high collector current, which is limited by resistor R3, and capacitor C1 begins to charge. The current flow in transistor Q1 causes current to flow through resistors R6 and R8 to thereby bias transistors Q3 and Q5 into conduction. The large collector current flow in transistors Q3 and Q5, particularly in the latter, causes the load capacitance $C_L$ of output terminal 12 to charge toward the $V_{CC}$ level. The charging of output terminal 12 takes place at a rapid rate due to the high current supplied by transistor Q5.

After the output terminal voltage reaches the level of the $V_{CC}$ source, capacitor C1 becomes charged to approximately 4.3 volts, (that is, the +5 volts at the base of transistor Q1 minus the approximate 0.7 volt base-emitter drop in that transistor). This reduces the base-to-emitter drive to transistor Q1 to a level of approximately 0.7 volts, which in turn reduces the value of the emitter-to-collector current of transistor Q1 to a level now determined by the value of resistor R2.

That reduced current also flows in resistors R6 and R8. Since the former has a greater value of resistance than the latter, the base-emitter voltage of transistor Q3 is sufficient to maintain it in conduction, but the base-emitter voltage of transistor Q5, to wit, the voltage drop across resistor R8, is insufficient to maintain transistor Q5 in conduction, whereupon it is cut off.

Thus, after the voltage at output terminal 12 reaches a quiescient level of $V_{CC}$, the high-current path through transistor Q5 is cut off, but terminal 12 still remains clamped to the $V_{CC}$ supply through the emitter-collector path of the low-current transistor Q3.

When the input signal subsequently drops to 0 volts, the voltage across capacitor C1 instantaneously remains at about 4.3 volts, transistors Q1, Q3, which are fast switching transistors, are both rapidly turned off, and transistor Q2 is turned on and draws a large collector current. This in turn causes transistors Q4 and Q6 to go into conduction, and output terminal 12 to be rapidly charged toward the negative $V_{DD}$ level. After the output terminal reaches the $V_{DD}$ level, capacitor C1 becomes charged to about 0.7 volts, that is, the base-emitter voltage drop of transistor Q2, thereby reducing the drive on that transistor, and causing a reduction of the emitter-collector current limited by the value of resistor R1. As before, the resulting reduced drive to transistors Q4 and Q6 causes the former to remain conductive and to clamp the output terminal to the $V_{DD}$ level through its collector-emitter circuit. Transistor Q6 is, however, at this time, rendered nonconductive thereby reducing the current supplied to the output terminal.

When the input signal returns to +5 volts, transistor Q1 and thus transistors Q3 and Q5 are once again turned on as described above, transistors Q2 and Q4 are cut off, and terminal 12 again charges toward the level of the $V_{CC}$ source.

The driver circuit of the present invention thus provides fast switching of clock or other bipolar signals to a high-capacitance load with hard clamping at both positive and negative levels. The provision of capacitor C1 in the input stage to reduce the drive on transistors Q1 and Q2 when the load reaches a quiescent condition, permits the circuit to supply a large current to the output only during transient periods, since the high-current output transistors Q5 and Q6 are then cut off. This has the desirable effect of reducing the circuit power dissipation to a minimum.

Moreover, even after the output transistor Q5 or Q6 is cut off, the output terminal remains clamped at either the positive or negative voltage through the still conducting intermediate transistor Q3 or Q4. Thus, in the present circuit, one relatively low speed and high-current transistor (Q5 or Q6) is used to provide the large switching current only during the charging period, while another relatively high-speed and low-current transistor (Q3 or Q4) maintains the clamp at a reduced current drain during the quiescent period and then switches off rapidly when it is desired to change the state of the output signal.

In addition, the input circuit configuration permits the collector of transistor Q1 to be returned to a positive voltage such as $V_{CC}$ greater than or equal to the positive swing of the input clock signal, and the collector of transistor Q2 to be returned to a negative voltage such as $V_{DD}$ less than or equal to 0 volts. The only design limitation would be the breakdown voltages of transistors Q3, Q4, Q5 and Q6. If it is desired to operate the circuit at a $V_{CC}$ supply of less than +5 volts, an additional resistor would have to be connected between the input terminal and ground to limit the input rise to a positive voltage equal to the $V_{CC}$ level. It is also with the scope of the present invention to replace transistors Q3 and Q5 (and Q4 and Q6) by single transistors if one were available combining the features of both high turnoff speed and large current drive.

Thus, whole only a single embodiment of the present invention has been herein specifically disclosed, it will be apparent that variations may be made therein without departure from the spirit and scope of the invention.

I claim:

1. A driver circuit for supplying signals to a high-capacitance load, said circuit comprising an input terminal for receiving an input signal at one of two levels, and an output terminal, first and second switch means operatively connected to said input terminal, third and fourth switch means respectively operatively connected to said first and second switch means and to said output terminal, first and second sources of signals at first and second levels, said third and fourth switch means being effective when actuated to respectively charge said output terminal to said first and second levels, said first and second switch means being selectively alternately actuated at different levels of said input signal and effective when so actuated to respectively actuate one of said third and fourth switch means, and means operatively connected to said first and second switch means and effective after one of said first and second switch means is actuated and while it remains actuated to respectively reduce the actuating signal to said third and fourth switch means.

2. The circuit of claim 1, further comprising fifth and sixth switch means respectively operatively connected to said third and fourth switch means, said first and second signal sources, and said output terminals, and respectively actuated upon the actuation of said third and fourth switch means to operatively connect said output terminal to one of said signal sources, and respectively deactuated when the drive to said third and fourth switch means is reduced from one of said first and second switch means in response to the action of said reducing means, said output terminal thereafter remaining in operative connection to one of said signal sources through one of said third and fourth switch means.

3. The circuit of claim 2, in which said drive reducing means comprises charging means operatively connected to said first and second switch means, initially at a first level, and chargeable to a second level after said one of said first and second switch means is actuated to reduce the actuating signal to said one of said first and second switch means.

4. The circuit of claim 3, in which said fifth and sixth switch means are each relatively high-current and low switching speed devices, and said third and fourth switching devices are each relatively low-current, and high-speed switching devices.

5. The circuit of claim 4, further comprising first and second control means respectively operatively connected to said third, and fifth switch means, and third and fourth control means respectively operatively connected to said fourth and sixth switch means, said first and third control means being respectively effective to maintain one of said third and fourth switch means conductive, and said second and fourth control means being effective to render nonconductive the previously actuated one of said fifth and sixth switch means after the actuating signal is reduced to one of said third and fourth switch means.

6. The circuit of claim 5, in which said third and fifth switch means are transistors of one type, and said fourth and sixth switch means are transistors of an opposite conductivity type said transistors having emitter and base terminals, said first and third control means comprising first and third resistors of a first value of resistance respectively operatively connected between the base and emitter terminals of said third and fourth switch means, said second and fourth control means comprising second and fourth resistors of a second value of resistance lower than said first value of resistance, and respectively operatively connected between the emitters of said third and fifth switch means and said fourth and sixth switch means.

7. The circuit of claim 6, in which said first and third resistors are operatively connected in series between said first signal source and said first switch means, and said second and fourth resistors are operatively connected in series between said signal source and said second switch means.

8. The circuit of claim 2, in which said fifth and sixth switch means are each relatively high-current and low switching speed devices, and said third and fourth switching devices are each relatively low-current, and high-speed switching devices.

9. The circuit of claim 8, further comprising first and second control means respectively operatively connected to the control terminals of said third, and fifth switch means, and third and fourth control means respectively operatively connected to the control terminals of said fourth and sixth switch means, said first and third control means being respectively effective to maintain one of said third and fourth switch means conductive, and said second and fourth control means being effective to render nonconductive the previously actuated one of said fifth and sixth switch means after the actuating signal is reduced to one of said third and fourth switch means.

10. The circuit of claim 9, in which said third and fifth switch means are transistors of one type, and said fourth and sixth switch means are transistors of an opposite conductivity type said transistors having emitter and base terminals, said first and third control means comprising first and third resistors of a first value of resistance respectively operatively connected between the base and emitter terminals of said third and fourth switch means, said second and fourth control means comprising second and fourth resistors of a second value of resistance lower than said first value of resistance, and respectively operatively connected between the emitters of said third and fifth switch means and said fourth and sixth switch means.

11. The circuit of claim 10, in which said first and third resistors are operatively connected in series between said first signal source and said first switch means, and said second and fourth resistors are operatively connected in series between said signal source and said second switch means.

12. The circuit of claim 1, in which said drive reducing means comprises charging means operatively connected to said first and second switch means, initially at a first level, and chargeable to a second level after said one of said first and second switch means is actuated to reduce the actuating signal to said one of said first and second switch means.

13. The circuit of claim 2, further comprising first and second control means respectively operatively connected to the control terminals of said third and fifth switch means, and third and fourth control means respectively operatively connected to the control terminals of said fourth and sixth switch means, said first and third control means being respectively effective to maintain one of said third and fourth switch means conductive, and said second and fourth control means being effective to render nonconductive the previously actuated one of said fifth and sixth switch means after the actuating signal is reduced to one of said third and fourth switch means.

14. The circuit of claim 2, further comprising first and second control means respectively operatively connected to said third, and fifth switch means, and third and fourth control means respectively operatively connected to said fourth and sixth switch means, said first and third control means being respectively effective to maintain one of said third and fourth switch means conductive, and said second and fourth control means being effective to render nonconductive the previously actuated one of said fifth and sixth switch means after the actuating signal is reduced to one of said third and fourth switch means, and in which said third and fifth switch means are transistors of one type, and said fourth and sixth switch means are transistors of an opposite conductivity type, said transistors having base and emitter terminals, said first and third control means comprising first and third resistors of a first value of resistance respectively operatively connected between the base and emitter terminals of said third and fourth switch means, said second and fourth control means comprising second and fourth resistors of a second value of resistance lower than said first value of resistance, and respectively operatively connected between the emitters of said third and fifth switch means and said fourth and sixth switch means.

15. A driver circuit for supplying signals at one of two levels to a high-capacitance load, said circuit comprising an input and an output terminal, first switch means operatively connected to said input terminal and actuated when said input signal is at one of its said levels, a source of a reference signal, second switch means operatively connected to said first switch means and said output terminal, third switch means operatively connected to said second switch means and said output terminal, said second and third switch means being actuated when said first switch means is initially actuated and effective when so actuated to operatively connect said reference signal source to said output terminal, and means operatively connected to said first switch means and effective after said first switch means is initially actuated and while it remains actuated to reduce the output of said first switch means and thereby deactuate one of said second and third switch means.

16. The circuit of claim 15, in which said one of said second and third switch means is a relatively high-current, low switching speed device, and the other of said second and third switch means is a relatively low-current and high-speed device.

17. The circuit of claim 16, in which said drive reducing means comprises charging means operatively connected to said first switch means, and chargeable from a first to a second level when said first switch means is actuated, and effective when at said second level to reduce the actuating signal to said first switch means.

18. The circuit of claim 17, further comprising first and second control means operatively connected to said second and third switch means, and effective to maintain the former conductive and to render the latter nonconductive when the drive from said first switch means is reduced.

19. The circuit of claim 18, in which said second and third switch means are transistors of a common conductivity type said transistors having emitter and base terminals, said first and second control means comprising first and second resistor means respectively operatively connected to the emitter and base terminals of said second and third switch means, said first resistor means having a higher value of resistance as compared to that of said second resistor means.

20. The circuit of claim 19, in which said first and second resistor means are in operative series connection between said source and said first switch means.

21. The circuit of claim 15, in which said drive reducing means comprises charging means operatively connected to said first switch means, and chargeable from a first to a second level when said first switch means is actuated, and effective when at said second level to reduce the actuating signal to said first switch means.

22. The circuit of claim 21, further comprising first and second control means operatively connected to said second and third switch means, and effective to maintain the former conductive and to render the latter nonconductive when the drive from said first switch means is reduced.

23. The circuit of claim 22, in which said second and third switch means are transistors of a common conductivity type said transistors having emitter and base terminals, said first and second control means comprising first and second resistor means respectively operatively connected to the emitter and base terminals of said second and third switch means, said first resistor means having a higher value of resistance as compared to that of said second resistor means.

24. The circuit of claim 16, further comprising first and second control means operatively connected to said second and third switch means, and effective to maintain the former conductive and to render the latter nonconductive when the drive from said first switch means is reduced, and in which said second and third switch means are transistors of a common conductivity type, said transistors having base and emitter terminals, said first and second control means comprising first and second resistor means respectively operatively connected to the emitter and base terminals of said second and third switch means, said first resistor means having a higher value of resistance as compared to that of said second resistor means.

25. The circuit of claim 24, in which said first and second resistor means are in operative series connection between said source and said first switch means.

26. The circuit of claim 15, further comprising first and second control means operatively connected to terminals of said second and third switch means, and effective to maintain the former conductive and to render the latter nonconductive when the drive from said first switch means is reduced.

27. The circuit of claim 26, in which said second and third switch means are transistors of a common conductivity type, said transistors having emitter and base terminals, said first and second control means comprising first and second resistor means respectively operatively connected to the emitter and base terminals of said second and third switch means, said first resistor means having a higher value of resistance as compared to that of said second resistor means.

28. The circuit of claim 27, in which said first and second resistor means are in operative series connection between said source and said first switch means.

* * * * *